United States Patent [19]

Claes et al.

[11] Patent Number: 5,452,041
[45] Date of Patent: Sep. 19, 1995

[54] APPARATUS FOR PROCESSING PHOTOGRAPHIC SHEET MATERIAL

[75] Inventors: Jan Claes, Heist Op Den Berg; Bart P. Verhoest, Kontich, both of Belgium

[73] Assignee: AGFA-Gevaert, Mortsel, Belgium

[21] Appl. No.: 303,673

[22] Filed: Sep. 9, 1994

[51] Int. Cl.$^6$ ............................................. G03D 5/00
[52] U.S. Cl. ..................................... 354/317; 354/318
[58] Field of Search ................... 354/304, 313–324, 354/337–339, 340; 355/27–29; 100/168, 176; 226/181, 184, 190, 196

[56] References Cited

U.S. PATENT DOCUMENTS

| | | |
|---|---|---|
| 3,877,805 | 4/1975 | Heldenbrand et al. .......... 354/317 X |
| 4,192,229 | 3/1980 | Tsunoi et al. .................... 100/158 R |
| 4,326,791 | 4/1982 | Beer et al. ........................ 354/321 |
| 4,719,484 | 1/1988 | Tahara et al. ................... 354/338 X |
| 4,864,343 | 9/1989 | Nelson ............................. 354/304 |

Primary Examiner—D. Rutledge
Attorney, Agent, or Firm—Brumbaugh, Graves, Donohue & Raymond

[57] ABSTRACT

An apparatus for processing photographic sheet material comprises a housing, a first roller shaft supported within the housing and first and second processing rollers rotatable on respective roller shafts supported within the housing. The second processing roller lies substantially parallel to the first, and in line contact therewith. Biasing means bias the roller shafts towards each other. Means are provided for feeding photographic sheet material between the rollers. Each of the rollers has a radially outer zone formed of deformable material and has a radial dimension profile which varies along the length thereof. Such a roller construction enables the bleeding of images on aluminium lithographic printing plates processed by the apparatus to be reduced.

18 Claims, 4 Drawing Sheets

APPARATUS FOR PROCESSING PHOTOGRAPHIC SHEET MATERIAL

FIELD OF THE INVENTION

This invention relates to an apparatus for processing photographic sheet material and particularly for developing exposed photographic material, and more particularly to apparatus for developing lithographic offset printing plates.

BACKGROUND OF THE INVENTION

In a system for the development of aluminium lithographic printing plates of the type disclosed in EP-A-410500 (Agfa Gevaert NV), the apparatus comprises a housing with pairs of processing rollers rotatable on roller shafts supported within the housing. The processing rollers are positioned substantially parallel and in line contact with each other. Means are provided for feeding photographic sheet material between the rollers. The roller shafts are biased towards each other to exert a pressure on the photographic sheet material as it passes between the rollers. Such rollers can usefully be used as squeegee rollers at the exit of a chemical bath to remove excess chemicals from the sheet material as it exits the bath. A good removal of processing liquid is also required to reduce the drying time of the sheet material after the last process bath, and hence to reduce the energy use.

Aluminium lithographic printing plates produced in this manner are liable to suffer from the problem of bleeding. Briefly explained, bleeding is said to occur when shadows of silver are deposited beyond the trailing edge of an image part, generating a zone in which the density differs from the expected background density. The mechanism of bleeding is thought to include the fact that some silver in the image part is insufficiently strongly held to the base and is therefore somewhat mobile.

It is known that bleeding can be reduced by passing the sheet material between a pair of rollers under high pressure, in particular passing the sheet material between such rollers at the output end of a liquid processing station, the rollers being biased together with a force significantly greater than that required for them to act as efficient squeegee rollers. However the extra force required to reduce bleeding in this manner requires the use of larger diameter rollers and/or engineering arrangements that involve additional space and cost.

SUMMARY OF THE INVENTION

It is an object of the present invention to provide an alternative apparatus for the processing of exposed photographic material, especially aluminium lithographic printing plates, in which the afore-mentioned problems of bleeding are reduced.

We have now discovered that this object can be achieved by a specific construction of the processing rollers.

According to the invention there is provided an apparatus for processing photographic sheet material comprising: a housing; a first roller shaft supported within the housing; a first processing roller carried on the first roller shaft and rotatable about its longitudinal axis; a second roller shaft supported within the housing; a second processing roller carried on the second roller shaft and rotatable about its longitudinal axis, each of the rollers having a radially outer zone formed of deformable material, the second processing roller lying substantially parallel to the first processing roller, and in contact therewith along the length thereof; and means for feeding photographic sheet material between the rollers; wherein each of the rollers has a radial dimension profile which varies along the length thereof.

By the term "roller shaft" at least 3 different mechanical possibilities are included, namely a) the case of a roller shaft intrinsically belonging to the processing roller, b) the case of a roller shaft entirely mounted through the axis of the processing roller, and c) the case of a roller shaft separately mounted in an end flange of the processing roller. Preferably, each of the roller shafts is supported beyond the ends of the associated processing roller. It is preferred that both rollers have the same radial dimension profile for ease of manufacturing.

In a preferred embodiment, each of the rollers comprises a non-deformable core, the thickness of the radially outer zone varying along the length thereof. Alternatively or additionally, the diameter of the core varies along the length thereof.

Ideally, the radial dimension profile of each roller is such in relation to the force exerted by the biasing means that the force applied by the rollers to sheet material passing there-between is substantially even over the width thereof.

The radial dimension of each roller ideally decreases towards the ends thereof i.e. a convex profile, especially a parabolic profile.

The deformable material may have a Shore A hardness of from 20 to 50. The deformable material may be selected from ethylene/propylene/diene terpolymers, polyurethane and silicone materials.

In a particularly convenient arrangement, the first roller is positioned above the second roller and the biasing means comprises spring means acting upon the first or upper roller. In order to obtain good imaging quality it is important for the rollers at the exit of each section, to exert a load in the order of 0.01 to 1.0 N/mm roller length, preferably 0.05–0.6 N/mm, to remove excess processing materials, the load ideally being applied at each end of the rollers. To this end the rollers are biased together, making use of the intrinsic elasticity of the deformable material. Alternatively, use may be made of springs which act on the ends of the roller shafts. The springs may be replaced by alternative equivalent compression means, such as e.g. a pneumatic or a hydraulic cylinder.

The housing may be divided into a plurality of sequential processing sections including at least a finishing section and a dryer section. Usually, the apparatus will include sequentially a developing section, a diffusion transfer section, a wash section, a rinse section, the finishing section and the dryer section. The upper and lower rollers may constitute outlet rollers of any or all such sections, but it is particularly preferable according to the present invention that the upper and lower rollers may constitute outlet rollers of the finishing section. The housing may include a partition separating the finishing section from the dryer section, the partition being formed with an opening to allow photographic sheet material to pass from the finishing section to the dryer section. The upper and lower rollers are advantageously positioned in the finishing section adjacent the opening in the partition.

Gas flow restriction means may be provided for restricting flow of hot gases from the dryer section to the finishing section through the opening. The gas flow restriction means preferably comprises a baffle screen mounted on the upper roller shaft. To enable easy access for maintenance, the baffle screen may be pivotally or slidably mounted on the upper roller shaft. Preferably, the partition is provided with a lip positioned to cooperate with the baffle screen to restrict flow of hot gases from the dryer section to the finishing section through the opening.

The apparatus according to the invention is particularly suitable for processing an aluminium based lithographic printing plate according to the silver salt diffusion transfer process, e.g. lithographic printing plates, of the type described in EP-A-410500.

EP-A-410500 discloses an imaging element containing an aluminium support provided with in the order given an image receiving layer and a silver halide emulsion. A diffusion transfer reversal process (hereinafter called the "DTR process") for obtaining a lithographic printing plate is disclosed in which said imaging element is image-wise exposed and subsequently developed using a developing liquid or activating liquid in the presence of a silver halide complexing agent. The imaging element is then guided through a diffusion transfer zone so that the silver halide complexes formed during the development step are allowed to diffuse into the image receiving layer where they are converted to silver. When the imaging element leaves the diffusion transfer zone a silver image is formed in the image receiving layer. The now useless photosensitive layer and optional other layers above the image receiving layer are then removed by guiding the imaging element through a washing and through a rinsing station. Finally the element now carrying a silver image on its surface is treated with a finishing liquid that contains a so-called hydrophobing agent for improving the hydrophobicity of the silver image.

In the above described method for obtaining an aluminium based lithographic printing plate according to the DTR process generally at least three different liquids are used i.e. a developing or activating liquid, a rinsing liquid and a finishing liquid.

The printing plate or imaging element is preferably prepared by coating different layers on a hydrophilic layer of a support. The hydrophilic layer of a support can be a hardened hydrophilic layer, containing a hydrophilic synthetic homopolymer or copolymer coated on a flexible hydrophobic base or, more preferably, the hydrophilic layer is part of an aluminium support. While the sheet material to be processed may be an imaging element as described above, containing an aluminium support provided with an image receiving layer and a silver halide emulsion, the support may alternatively be constituted by other materials, such as polyester.

PREFERRED EMBODIMENTS OF THE INVENTION

The invention will now be further described, purely by way of example, by reference to the accompanying drawings in which.

Figure 1:
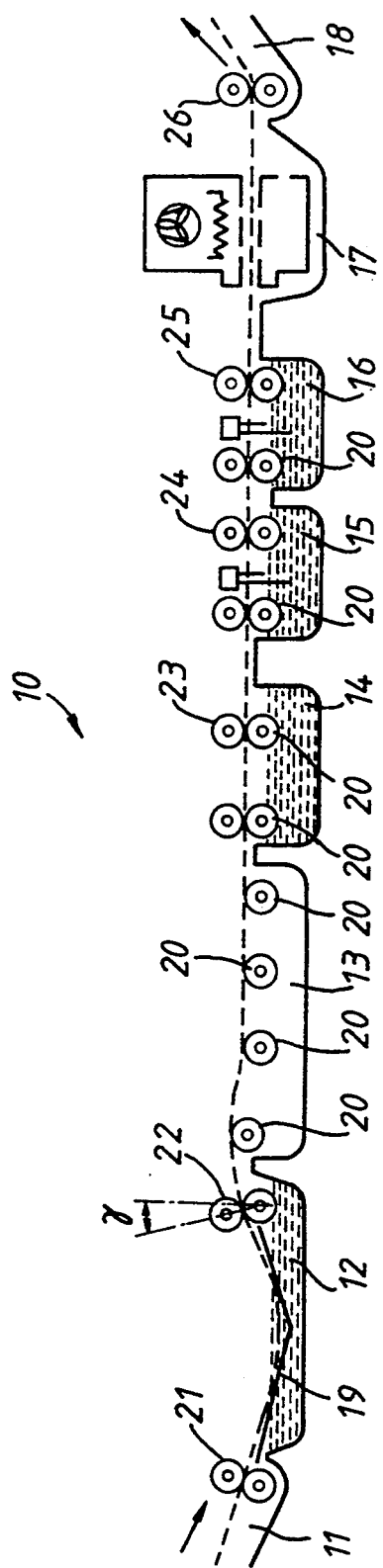
FIG. 1 is a schematic longitudinal lay-out of a embodiment of a processing apparatus according to the invention.

With reference to FIG. 1 there is illustrated a longitudinal section through an apparatus for processing exposed photographic sheet material. The processing apparatus is mounted within a generally rectangular housing 10 which may include a rectangular metal mainframe (not shown in FIG. 1 for the sake of clarity) for supporting the various sections of the apparatus. The apparatus comprises a sheet feed means 11, in the form of a pair of feeding rollers 21, a developing section 12, a diffusion transfer section 13, a wash section 14, a rinse section 15, a finishing section 16, a dryer section 17, and an output section 18 with output rollers 26.

All these sections include conveyor rollers 20. The exit ends of the developing section 12, the washing section 14, the rinsing station 15 and the finishing section 16 have sets of squeegee rollers 22, 23, 24 and 25 to remove excess liquid from the sheet material as it exits the respective section. Since each set of said squeegee rollers 22, 23, 24 and 25 is identical, only one set of rollers 22 will be described. Moreover, since also the other pairs of rollers, such as the rollers 20 at the entrance of any bath, have the same construction (but reduced biasing pressure), all roller pairs will hereinafter be called "processing rollers", including squeegee as well as non-squeegee rollers.

In FIG. 1 each of the upper rollers of said processing rollers is caused to rotate anticlockwise by a drive device (not shown) and both processing rollers are biased together so that each of the lower rollers of said processing rollers is driven clockwise to pass sheet material through the rollers and towards the output 18 of the processing apparatus.

In order to break the meniscus of any process liquid resting on the processing rollers when the apparatus is idle, a displacement device is provided by which one of the processing rollers is able to displace between e.g. 0.1 to 25 mm, preferably 1 to 6 mm away from the other of said processing rollers, i.e. from a closed position to an open position.

Figure 2:
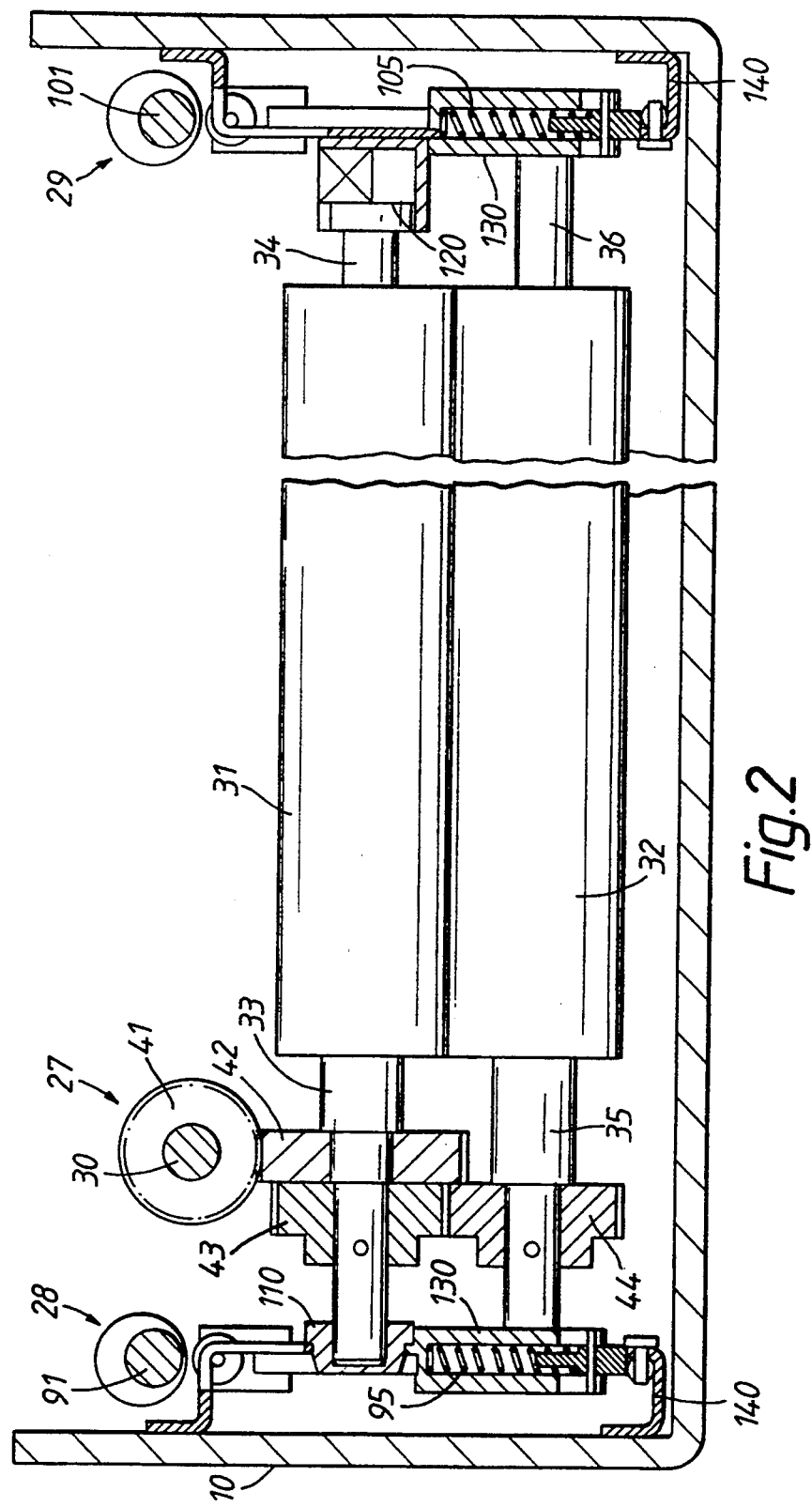
FIG. 2 is an elevational view of a pair of processing rollers for use in the apparatus shown in FIG. 1.

Making reference to FIG. 2, the drive device generally indicated by reference 27, and the displacement device generally indicated by reference 28 and 29 are shown.

All the rollers 20 to 26 are linked by a single drive shaft 30 to operate simultaneously to advance sheet material through the apparatus from the feed means 11 to the output section 18. Each set of processing rollers 22 comprises a first (upper) roller 31 and a second (lower) roller 32. The upper roller 31 is fixed on respective shafts 33 and 34 for rotation and the lower roller 32 is fixed on respective shafts 35 and 36 for rotation. The roller shafts 33, 34, 35, 36 are mounted at each end in bearings held in respective sub-frames 140. Each of the rollers 31, 32 is constructed by assembling a hollow cylinder covered with a suitable elastomer, and fitted at each end of said cylinder a rigid flange and a shaft 33, 34, 35 and 36. Although normally each processing roller thus incorporates two roller shafts, also a construction wherein a cylindrical roller is assembled with only one roller shaft, axially going through the whole cylinder, can also be used in accordance with the present invention. Even the possibility of constructing said processing roller from a massive cylindrical roller with shafts made from one same material can also be used in accordance with the present invention.

In a preferred embodiment, the drive device 27 comprises a mechanical transmission for driving said processing roller 31 and a set of co-operating gears located at one end and at the same side of both roller shafts 33, 35. The upper processing roller 31 is driven at one end thereof through a worm-screw 41 and a worm-wheel 42 by the drive shaft 30. The lower processing roller 32 is driven by a helical gear 44 which meshes with another helical gear 43. The drive shaft 30 is driven preferably by an electric motor with an encoding disc system (not shown) in order to control the speed and the progressing horizontal position of the sheet material.

The coordinates of the upper processing roller 31 are defined by the end bearings 110 and 120. The lower roller 32 rotates in two bearing plates 130 which slide vertically in guides (not shown) in the sub-frames 140 so that the lower roller 32 is free to move towards and away from the upper roller 31 as the processing rollers move between the open and closed positions.

Compression springs 95, 105 bias the lower roller 32 towards the upper roller 31 by a force of up to 400N at a roller length of about 850 mm.

The camshafts 91, 101 are each driven by a synchronised electric motor with an encoding disc system (not shown) in order to control the vertical displacement of the displaceable processing roller 32.

The axis of rotation of the two processing rollers 31 and 32, respectively, may be offset by an angle $\gamma$ (see FIG. 1), preferably between 0° and 20°, from the vertical towards the feed side of the rollers so that if necessary the rollers 31, 32 are arranged in a line normal to an inclined feed surface.

Figure 3:
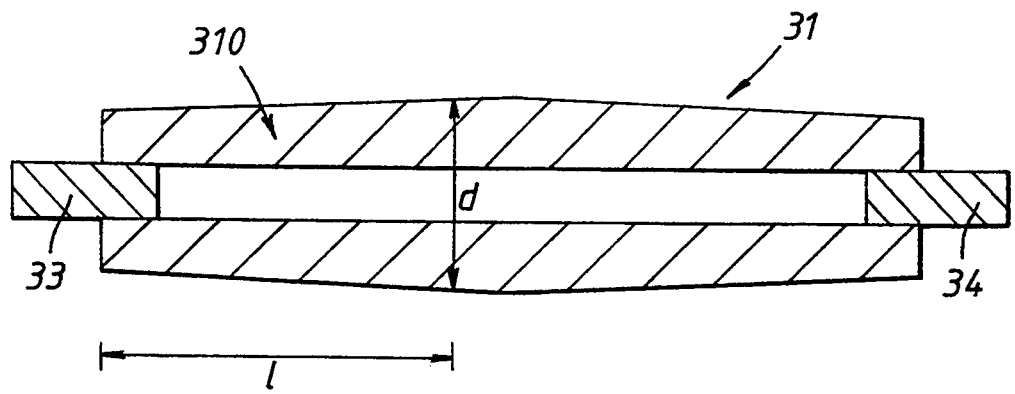
FIG. 3 is a cross-sectional view of one of the processing rollers shown in FIG. 2.

Referring to FIG. 3, it will be seen that the processing roller 31, mounted on roller shafts 33, 34 comprises a radially outer zone 310 of circular cross-section formed of elastomeric material. The diameter d of the roller 31 varies along the length l thereof. In a particular example where the roller has a length of 850 mm, the diameter at various points along the length of the roller are as set out in Table I:

TABLE I

| l (mm) | d (mm) | l (mm) | d (mm) |
| --- | --- | --- | --- |
| 0 | 39.00 | 425 | 40.00 |
| 25 | 39.28 | 450 | 40.00 |
| 50 | 39.34 | 475 | 39.98 |
| 75 | 39.42 | 500 | 39.97 |
| 100 | 39.50 | 525 | 39.94 |
| 125 | 39.56 | 550 | 39.92 |
| 150 | 39.62 | 575 | 39.88 |
| 175 | 39.68 | 600 | 39.84 |
| 200 | 39.74 | 625 | 39.80 |
| 225 | 39.80 | 650 | 39.74 |
| 250 | 39.84 | 675 | 39.68 |
| 275 | 39.88 | 700 | 39.62 |
| 300 | 39.92 | 725 | 39.56 |
| 325 | 39.94 | 750 | 39.50 |
| 350 | 39.97 | 775 | 39.42 |
| 375 | 39.98 | 800 | 39.34 |
| 400 | 40.00 | 825 | 39.24 |
|  |  | 850 | 39.00 |

Thus it will be seen in this example that the diameter of the roller has a parabolic profile, the diameter decreasing towards the ends thereof. The profile of this roller is such that, where the lower roller is similarly constructed and a biasing force of 380N/850 mm is applied by the springs 95 and 105 and the elastomer is EPDM (ethylene/propylene/diene terpolymer) having a Shore A hardness of 40, the force applied by the rollers to aluminium sheet material having a thickness of 0.1 to 0.4 mm passing between the rollers is substantially even over the width thereof.

Figure 5:
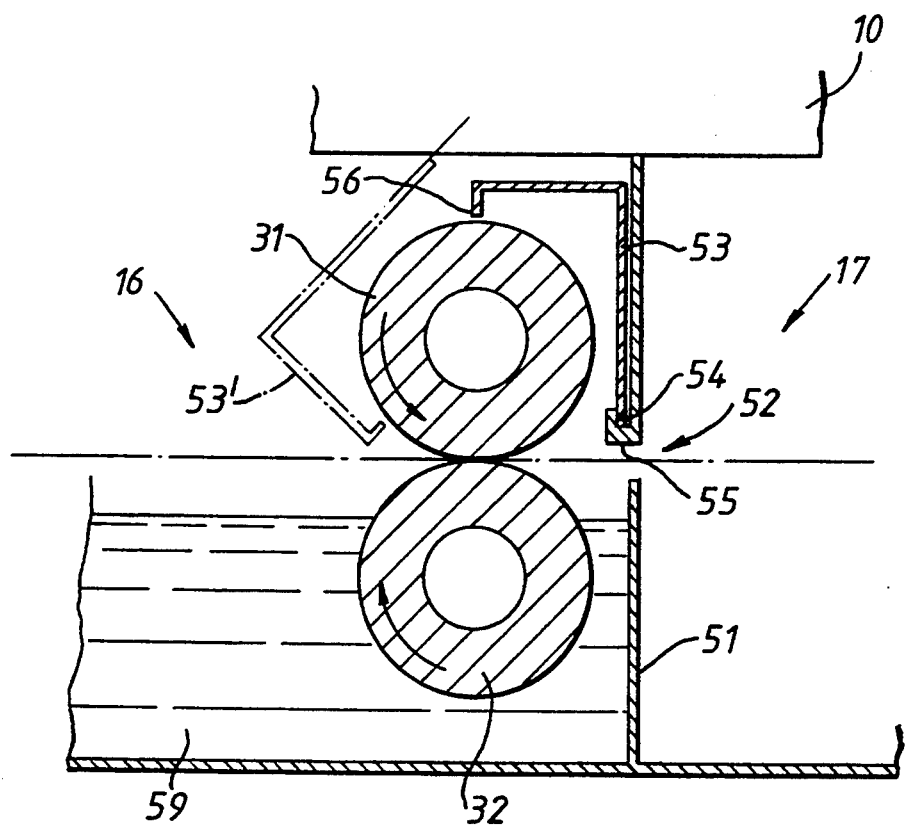
FIG. 5 is a cross-sectional view of the pair of processing rollers shown in FIG. 2, together with associated parts of the apparatus.
Figure 4:
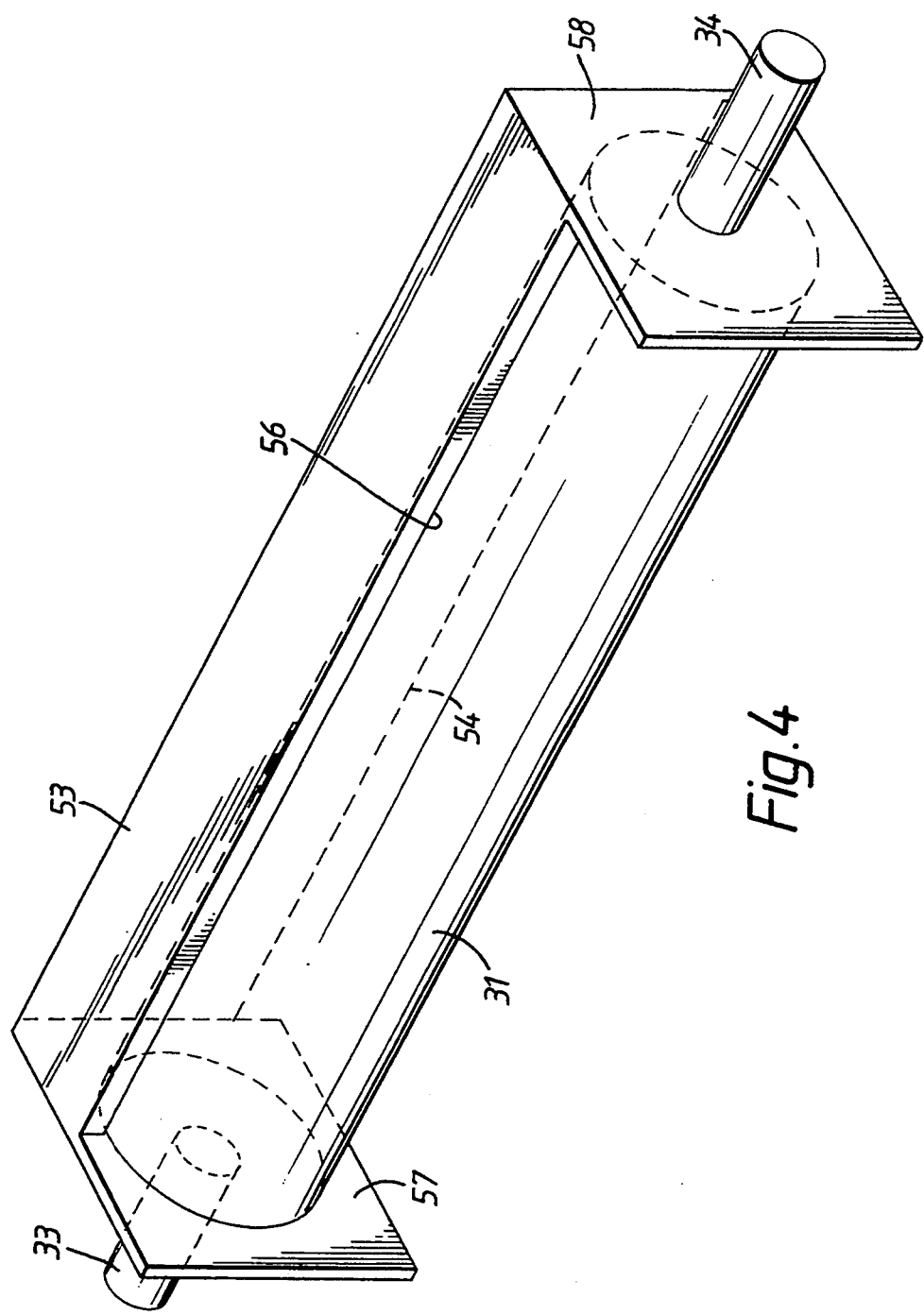
FIG. 4 is a perspective view of the roller shown in FIG. 3, together with an associated baffle screen.

The housing 10 is divided into its respective sections by partitions, the partition 51 between the finishing section 16 and the dryer section 17 being shown in FIG. 5, adjacent the upper, and lower rollers 31, 32. The partition 51 is formed with a slot-like opening 52 to allow the aluminium sheets to pass from the finishing section 16 to the dryer section 17. The dryer section 17 includes means (not shown) for heating the air therein to a temperature of 40° to 80° C., such as about 60° C., the hot air serving to dry the aluminium sheet as it passes from the finishing section 16. According to an advantageous feature of the present invention, a baffle screen 53 is provided to restrict the flow of gas from the dryer section into the finishing section. The baffle screen has a lower longitudinal edge 54 which is located in a lip 55 provided on the partition 51 adjacent the opening 52 and an upper longitudinal edge 56 positioned close to the surface of the upper roller 31. The baffle screen 53 is provided with side plates 57, 58 which are pivotally mounted on the roller shafts 33, 34 respectively. The baffle screen 53 can therefore be pivoted into the position indicated by reference 53' in FIG. 5 to allow access to the upper roller 31 for maintenance purposes. The baffle screen 53 serves to restrict the flow of hot gases from the dryer section 17 to the finishing section 16, thereby reducing the extent of evaporation from the processing liquid 59 in the finishing section 16, the processing liquid having a temperature of from 20° to 60° C., such as about 45° C.

We claim:

1. Apparatus for processing photographic sheet material comprising:
   a housing;
   a first roller shaft supported within said housing;
   a first processing roller carried on said first roller shaft and rotatable about its longitudinal axis;
   a second roller shaft supported within said housing;
   a second processing roller carried on said second roller shaft and rotatable about its longitudinal axis, said second processing roller lying substantially parallel to said first processing roller, and in contact therewith along the length thereof; and
   means for feeding photographic sheet material between said rollers;
   wherein each of said rollers has a radially outer zone formed of deformable material, and each of said rollers has a radial dimension profile which varies along the length thereof.

2. Apparatus according to claim 1, wherein each of said roller shafts is supported beyond the ends of the associated processing roller.

3. Apparatus according to claim 2, wherein the radial dimension of each said roller decreases towards the ends thereof.

4. Apparatus according to claim 3, wherein each of said rollers comprises a non-deformable core, the thickness of said radially outer zone varying along the length thereof.

5. Apparatus according to claim 3, wherein each of said rollers comprises a non-deformable core, the diameter of said core varying along the length thereof.

6. Apparatus according to claim 1, wherein the radial dimension profile of each said roller is such in relation to the force exerted by said biasing means, that the force applied by the rollers to sheet material passing therebetween is substantially even over the width thereof.

7. Apparatus according to claim 1, wherein said deformable material has a Shore A hardness of from 20 to 50.

8. Apparatus according to claim 1 wherein said deformable material is selected from ethylene/propylene/diene terpolymers, polyurethane and silicone materials.

9. Apparatus according to claim 1, wherein said first roller is positioned above said second roller and said biasing means comprises spring means acting upon said first roller.

10. Apparatus according to claim 1, wherein said housing is divided into a plurality of sequential processing sections including at least a finishing section and a dryer section.

11. Apparatus according to claim 10, wherein said first and second rollers constitute outlet rollers of said finishing section.

12. Apparatus according to claim 10, wherein said housing includes a partition separating said finishing section from said dryer section, said partition being formed with an opening to allow photographic sheet material to pass from said finishing section to said dryer section.

13. Apparatus according to claim 12, wherein said first and second rollers are positioned in said finishing section adjacent said opening in said partition.

14. Apparatus according to claim 13, further comprising gas flow restriction means for restricting flow of hot gases from said dryer section to said finishing section through said opening.

15. Apparatus according to claim 14, wherein said gas flow restriction means comprises a baffle screen mounted on said first roller shaft.

16. Apparatus according to claim 15, wherein said baffle screen is pivotally mounted on said first roller shaft.

17. Apparatus according to claim 16, wherein said partition is provided with a lip positioned to co-operate with said baffle screen to restrict flow of hot gases from said dryer section to said finishing section through said opening.

18. Use of an apparatus according to claim 1 for processing an aluminium based lithographic printing plate according to the silver salt diffusion transfer process.

* * * * *